United States Patent [19]
Feldman et al.

[11] Patent Number: 5,237,434
[45] Date of Patent: Aug. 17, 1993

[54] MICROELECTRONIC MODULE HAVING OPTICAL AND ELECTRICAL INTERCONNECTS

[75] Inventors: Michael R. Feldman, Charlotte; Iwona Turlik, Raleigh; Gretchen M. Adema, Durham, all of N.C.

[73] Assignee: MCNC, Research Triangle Park, N.C.

[21] Appl. No.: 787,938

[22] Filed: Nov. 5, 1991

[51] Int. Cl.[5] .......................... G02B 5/32; G02B 6/34; G02B 27/00; G11C 5/12
[52] U.S. Cl. ........................................ 359/19; 359/15; 385/14; 385/37; 257/737; 250/551; 365/64
[58] Field of Search .......................... 359/1, 15, 19, 34; 385/14, 37; 365/64; 257/737

[56] References Cited

U.S. PATENT DOCUMENTS

| | | |
|---|---|---|
| 4,711,997 | 12/1987 | Miller . |
| 4,762,382 | 8/1988 | Husain et al. ........................ 385/14 |
| 4,774,630 | 9/1988 | Reisman et al. ...................... 357/82 |
| 4,838,630 | 6/1989 | Jannson et al. ....................... 359/15 |
| 4,912,545 | 3/1990 | Go ....................................... 257/737 |
| 5,061,027 | 10/1991 | Richard ................................ 385/14 |
| 5,101,460 | 3/1992 | Richard ................................ 359/19 |

FOREIGN PATENT DOCUMENTS

0420029A1  9/1990  European Pat. Off. .

OTHER PUBLICATIONS

Haugen et al., "Optical interconnects for high speed computing;" Optical Engineering, Oct. 1986, vol. 25, No. 10, p. 1076.

"Comparison between optical and electrical interconnects based on power and speed considerations," Applied Optics/vol. 27, No. 9/1 May 1988, p. 1742.

"Interconnect density capabilities of computer generated holograms for optical interconnection of VLSI circuits", Applied Optics/vol. 28, No. 15/1 Aug. 1989, p. 3134.

PCT International Search Report dated Mar. 9, 1993 of International Appln. No. PCT/US92/09381 filed Feb. 11, 1992.

*Optics Evolve as a Viable Interconnection Alternative*, H. W. Markstein, 8307 Electronic Packaging & Production 31 (1991) Apr., No. 4.

*System Issues Relating to Laser Diode Requirements for VLSI Holographic Optical Interconnects*, E. Bradley et al., Optical Engineering, vol. 28 (1989) Mar., No. 3, pp. 201–211.

*Chip Alignment Templates for Multichip Module Assembly*, S. K. Tewksbury et al., IEEE Transactions on Components, Hybrids, and Manufacturing Technology, vol. CHMT-10, No. 1, Mar. 1987, pp. 111–121.

*Primary Examiner*—Scott J. Sugarman
*Assistant Examiner*—Evelyn A. Lester
*Attorney, Agent, or Firm*—Bell, Seltzer, Park & Gibson

[57] ABSTRACT

A multichip module having high density optical and electrical interconnections between integrated circuit chips. An optically transparent substrate is positioned overlying an array of integrated circuit chips mounted on a mounting substrate. The mounting substrate may include a heat sink to remove excess heat from the integrated circuit chips. The multichip module includes integrated circuit chips having optical detectors and optical transmitters to establish optical interconnections therebetween. A hologram is positioned in the optical path between the optical transmitters and the optical detectors. A planar mirror is preferably positioned opposite the hologram to direct the optical beams. The optically transparent substrate also includes an array of electrical contact pads to establish electrical connections with corresponding electrical contact pads on the underlying integrated circuit chips. A pattern of electrical interconnection lines is provided on at least one of the mounting substrate or the transparent substrate to electrically interconnect predetermined ones of the integrated circuit chips.

27 Claims, 4 Drawing Sheets

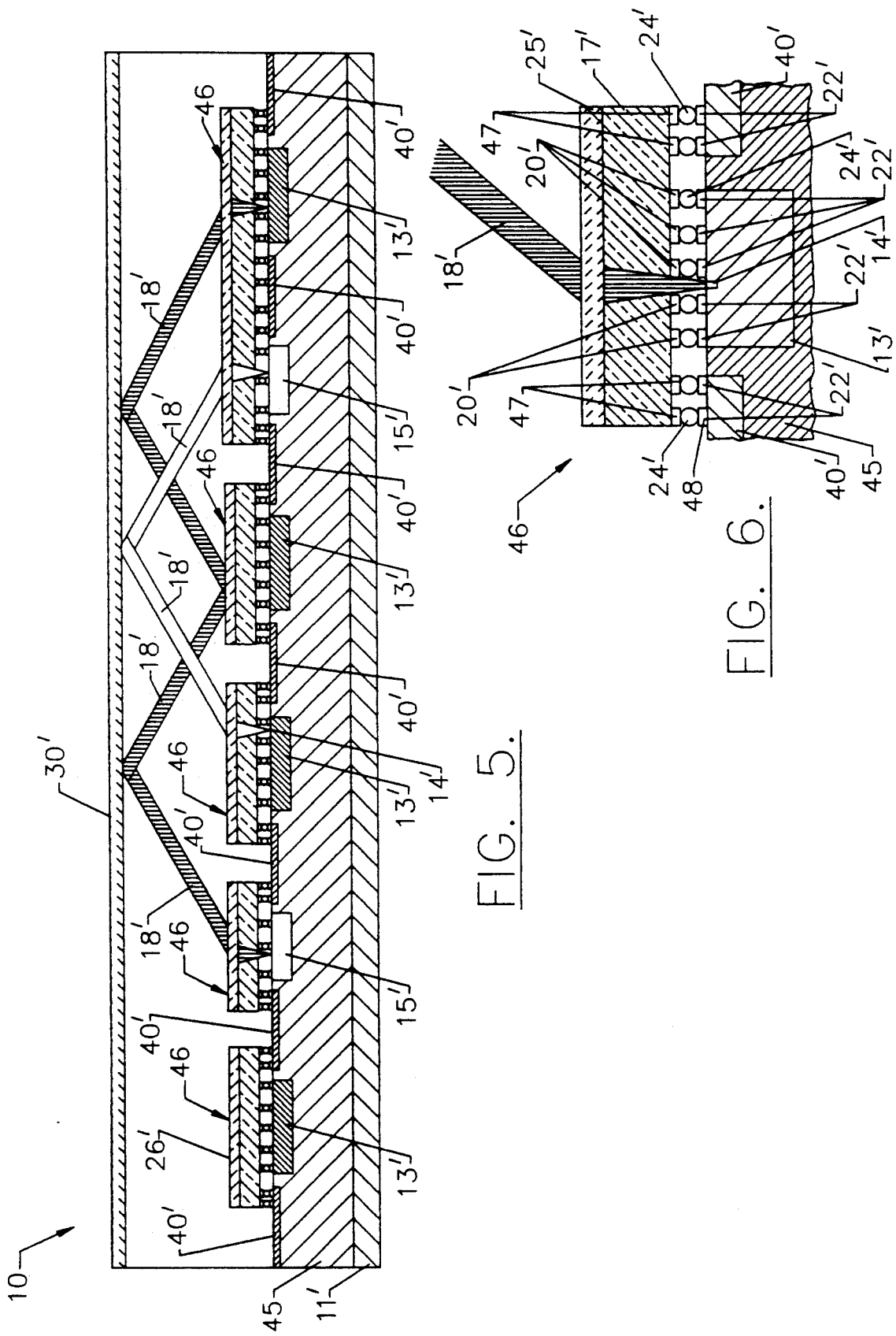

MICROELECTRONIC MODULE HAVING OPTICAL AND ELECTRICAL INTERCONNECTS

FIELD OF THE INVENTION

The invention relates to the field of microelectronic packaging and, more particularly, to a module having a plurality of integrated circuit chips and high density optical and electrical interconnections between chips.

BACKGROUND OF THE INVENTION

State of the art microelectronic systems commonly employ multichip modules. A multichip module includes an array of integrated circuit chips which require signal interconnections between the chips. Multichip modules having only electrical interconnections between chips have only limited performance and are not suitable for many next-generation highly parallel computational systems, for example. Since such computational systems require high density interconnection networks containing many relatively long distance interconnections, the minimization of the area, power and time delay of the chip-to-chip and module-to-module interconnections are critical.

Next-generation processor arrays will likely include hundreds of chips containing up to 512, or more, individual Processing Elements (PE's) per chip. Since efficient interconnection networks for many algorithms require at least one long distance connection per processing node, a multichip module capable of providing such a large number of interconnections per chip is desired. For a multichip module containing 64 chips, for example, over 32,000 high speed chip-to-chip interconnections would be required. In addition, module-to-module interconnections may be desired for increased processor array size, clock signal distribution, or communication with a controller or a shared memory. Accordingly, in such highly connected systems, the module-to-module and long distance chip-to-chip connections are responsible for the majority of the power dissipation, time delay and surface area consumed. Stated simply, the interconnections present a bottleneck to higher speeds of operation.

Fully electrically interconnected multichip modules are known in the art as disclosed in U.S. Pat. No. 4,774,630 to Reisman et al. A plurality of chips are mounted on a substrate in an inverted position so that the electrical connection pads are exposed on the upper surface of the chip. A passive "translator chip" is positioned over the electrical connection pads of the integrated circuit chip. The translator chip also covers a portion of the substrate surrounding the chip so that interconnections between the chip and the substrate are established. Unfortunately, the densities achievable with electrical interconnections alone are limited, since all chip-to-chip connections must be implemented with a small number (2-4) of planar layers. In addition, electrical interconnections are limited for signal fanout.

Optical interconnections have been developed with the potential to increase communication speed, and reduce the volume, crosstalk and power dissipation of electrical interconnections. Guided-wave optical interconnections are described in an article entitled "Optical Interconnects for High Speed Computing," by Haugen et al. and appearing in Optical Engineering, Vol. 25, pp. 1076-1085, 1986. U.S. Pat. No. 4,762,382 to Husain et al. also discloses optical channel waveguides formed on a silicon chip carrier to interconnect Gallium Arsenide (GaAs) chips. Silicon chips are also included on the chip carrier.

Although guided-wave optical interconnections have the advantages of low cost and low fabrication and packaging complexity, they have the disadvantages of inherent lower communication speed, less flexibility and less interconnection density capacity than holographic interconnections. The reduced interconnection capacity stems from the planar nature of guided-wave interconnections. Although in some cases two waveguides can cross at 90 degree angles with little crosstalk, it is difficult to achieve similar results with waveguides crossing at other angles. Since waveguides are formed by embedding a high index of refraction core material within a lower index cladding material, the optical signals in low loss waveguides travel at a relatively slower speed than free space propagation of the optical signals.

Holographic interconnections do not suffer from some of the limitations of the guided-wave optical interconnections. An article entitled "Interconnect Density Capabilities of Computer Generated Holograms for Optical Interconnection of Very Large Scale Integrated Circuits," by coinventor Feldman et al. which appeared in APPLIED OPTICS, Vol. 28, No. 15, pp. 3134-3137, Aug. 1, 1989, discloses free space optical interconnections between chips of a multichip module to increase interconnection densities. The chips may be arranged so that optical transmitters and detectors are on a common circuit plane, different circuit planes, or a mixture of both. Computer generated holograms are used to form the required optical interconnections. An article entitled "A Comparison Between Optical and Electrical Interconnects Based on Power and Speed Consideration, Applied Optics, Vol. 27, pp. 1742-1751, May 1, 1988, by coinventor Feldman et al. also discloses optical connections using one or more holograms.

Despite improvements in achieving higher interconnection densities, first with guided-wave optical interconnections, and later with free-space holographic interconnections, there still exists a need for higher densities and higher speeds of operation, such as required for highly parallel computationally intensive applications. In addition, as integrated circuit chip densities increase, there is an additional requirement that a multichip module having optical interconnections include facilities to readily remove excess heat from the chips.

SUMMARY OF THE INVENTION

In view of the foregoing background, it is an object of the present invention to provide a multichip module having high density, high speed, high frequency interconnections.

It is another object of the invention to provide a multichip module that may be readily cooled to provide stable operation of the multichip module.

These and other objects according to the present invention are provided by a multichip module that includes both optical and electrical interconnections. The multichip module includes a first substrate which may be a heat sink or which may be a substrate with a heat sink adjacent thereto. The first substrate serves as a mounting substrate for an array of integrated circuit chips of the multichip module.

The integrated circuit chips each have a bottom surface positioned on the mounting substrate to conduct excess heat away from the chip and to the heat sink. Each of the integrated circuit chips includes an array of electrical contact pads on its top surface. One or more of the chips further includes an optical detector and/or and optical transmitter for establishing optical interconnections between chips.

An optically transparent substrate is positioned adjacent the top of the integrated circuit chips. The transparent substrate permits optical beams to pass therethrough from the optical transmitters to associated optical detectors. One or more holograms and a mirror spaced-apart therefrom are positioned in the optical path of the optical transmitters and detectors to direct the optical beams between predetermined ones of the chips.

The transparent substrate also includes an array of electrical contact pads corresponding to the array of electrical contact pads on a respective underlying integrated circuit chip. A pattern of electrical interconnection lines may be provided either on the mounting substrate, or on the optically transparent substrate or both, for electrically interconnecting predetermined ones of the integrated circuit chips.

In one embodiment of the invention, a common optically transparent substrate is positioned over the entire array of the integrated circuit chips. The transparent substrate includes the pattern of electrical interconnection lines thereon to electrically interconnect the chips. The substrate includes an individual hologram for each optical transmitter and detector of the array of integrated circuit chips.

In a second embodiment of the invention, an interconnect chip, also referred to herein as a "holographic translator chip", is used in place of the common transparent substrate in the multichip module. In addition, the pattern of electrical interconnection lines is formed on the mounting substrate rather than the transparent substrate. The holographic translator chip includes a hologram for directing an optical beam either to an underlying optical detector or from an underlying optical source.

In a third embodiment of the invention, the multichip module includes a common hologram for all of the optical detectors and transmitters. A plurality of interconnect chips, also referred to herein as "translator chips", are positioned over respective integrated circuit chips. The translator chips have a transparent substrate and provide only the electrical interconnection to the integrated circuit chips. A common hologram is positioned in spaced-apart relation above the translator chips. The common hologram includes respective sub-holograms for the optical transmitters and detectors.

The multichip module according to the present invention is readily manufactured using "flip-chip" bonding techniques. Flip-chip bonding is used both to establish electrical interconnections and to laterally self-align the components as required for precision optical alignment. The flip-chip bonding uses solder bumps on an array of electrical contact pads and reflowing the solder to form the interconnections.

Another aspect of the present invention is the use of an edge-emitting laser array as an optical source. The edge-emitting laser array is used in conjunction with a mirror to redirect the optical beams at a right angle so that the optical beams pass through the respective holograms. The edge-emitting laser arrays are capable of high frequency operation and are relatively inexpensive.

BRIEF DESCRIPTION OF THE DRAWINGS

FIG. 5 is a schematic cross-sectional view of a second embodiment of a multichip module according to the invention.

FIG. 6 is an enlarged schematic cross-sectional view of a holographic translator chip as shown in FIG. 5.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, applicants provide these embodiments so that this disclosure will be thorough and complete, and will fully convey the scope of the invention to those skilled in the art. Prime notation is used to indicate similar elements in various embodiments of the present invention. The thickness of layers and regions are exaggerated for clarity.

Figure 1:
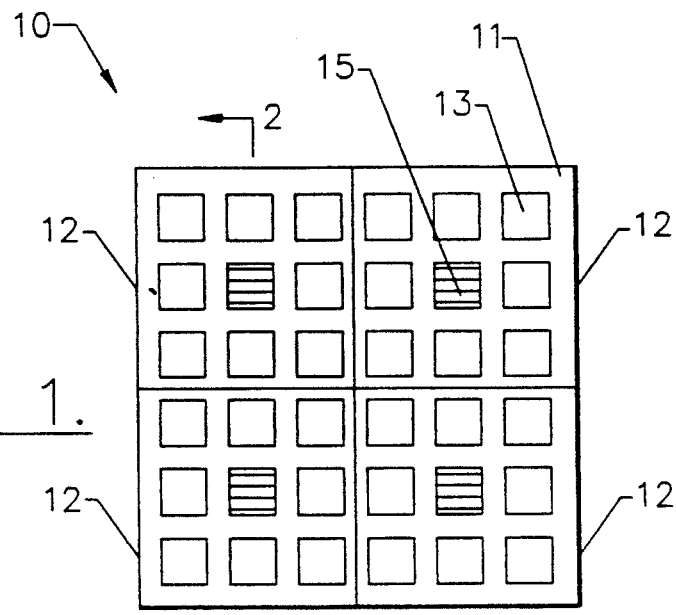
FIG. 1 is a schematic top plan view of a portion of a first embodiment of a multichip module according to the present invention.
Figure 3:
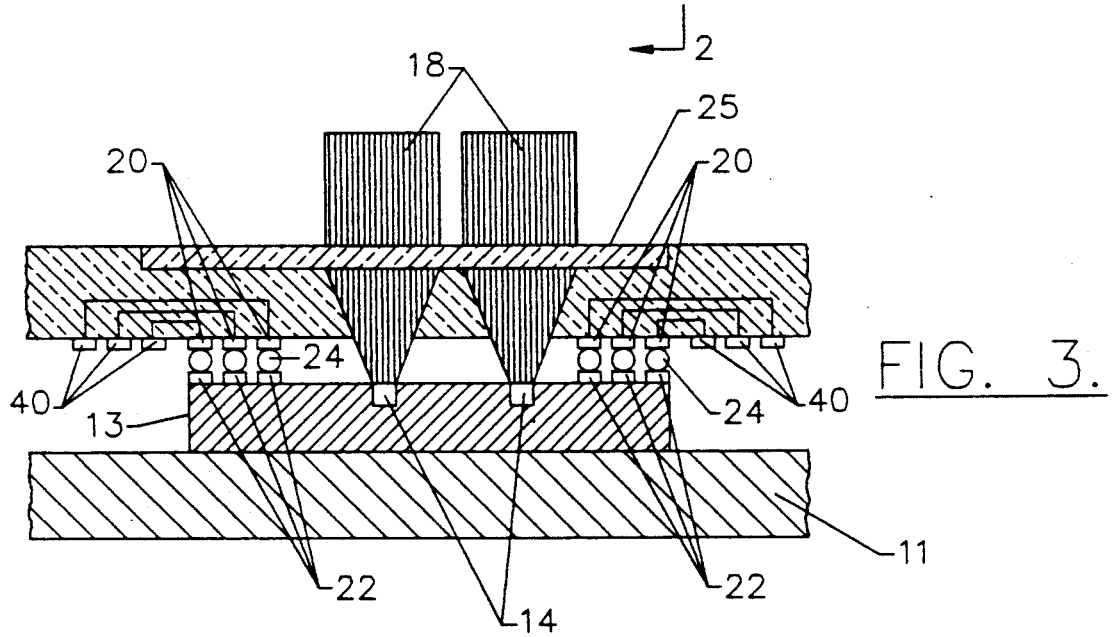
FIG. 3 is an enlarged schematic cross-sectional view of a portion of a multichip module according to the invention including an integrated circuit chip having two optical detectors.
Figure 2:
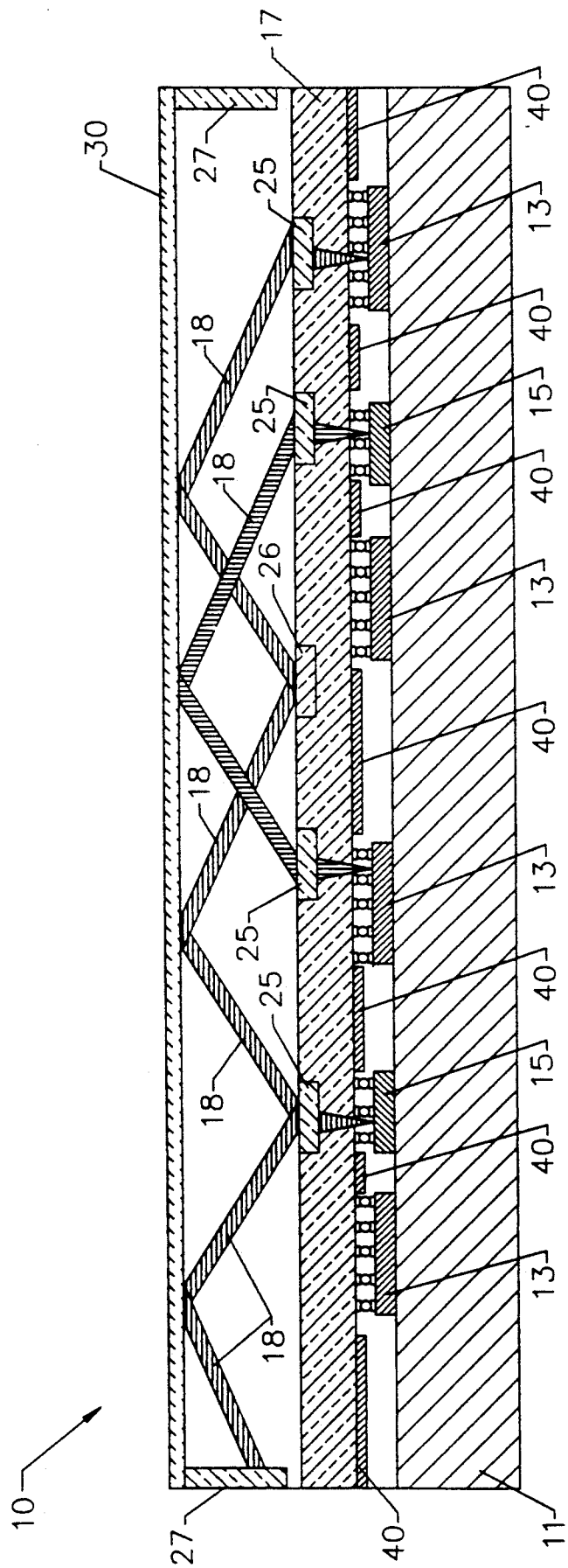
FIG. 2 is a schematic cross-sectional view of the multichip module along lines 2—2 of FIG. 1.

A first embodiment of the multichip module 10 according to the invention is shown in FIGS. 1 and 2. The multichip module 10 provides both optical and electrical interconnections. The multichip module 10 includes a heat sink 11 upon which an array of integrated circuit chips are positioned. The integrated circuit chips include chips 13 with integrated optical detectors 14, as shown in FIG. 3, and semiconductor laser array chips 15, as more fully described below. The chips 13 with the integrated optical detectors 14 may be very large scale integration (VLSI) or ultra large scale integration (ULSI) chips or other microelectronic devices well known to those having skill in the art.

The heat sink 11 may serve as a mounting substrate for the integrated circuit chips 13, 15, as well as removing excess heat from the chips to permit increased speeds of operation, permit higher power operation, and to increase the stability of operation of the chips. The heat sink 11 may be a ceramic material and/or may include water and/or air cooling as would be readily known to those skilled in the art. Experimental testing of other multichip modules suggest that conventional cooling schemes may allow for a power dissipation of 40 W/cm$^2$ with a temperature rise at the surface of the integrated circuit chips 13, 15 of only about 15° C.

Signal interconnections beyond a predetermined distance, such as 5 cm, and interconnections between adjacent multichip modules 10 may be implemented optically. In addition, those interconnections which have high fanout may also be implemented optically. Accordingly, high frequency electrical interconnections are only needed for short distances, for example on the order of 3 mm, and when fanout is not required. Moreover, GHz frequencies are possible and the integrated circuit chips 13, 15 will remain stable in operation because of the ability to efficiently remove excess heat with the heat sink 11.

As shown in the schematic plan view of FIG. 1, the multichip module 10 may include a single laser array chip 15 serving more than one of the chips 13 with integrated optical detectors 14. An advantage of the centrally located laser array chip 15 serving surrounding integrated circuit chips 13, is that the electrical interconnections can be maintained relatively short as described above. While the illustrated embodiment shows four sections 12, each with a laser array chip 15, additional sections and other configurations are possible. For example, a three-by-three arrangement of sections 12, not shown, may also be employed in a multichip module according to the invention.

As shown in FIG. 2, the multichip module 10 includes a substrate 17 comprising an optically transparent material, such as quartz, diamond, sapphire, silicon nitride ($Si_3N_4$), or transparent polymers. The transparent material is desirably compatible in thermal expansion characteristics with the material of the integrated circuit chips 13, 15. The transparent substrate 17 is positioned overlying the integrated circuit chips 13, 15 in the illustrated embodiment. The transparent material provides means for permitting passage therethrough of optical beams 18 between the laser array chips 15 and the chips 13 having the integrated detectors 14.

Figure 4:
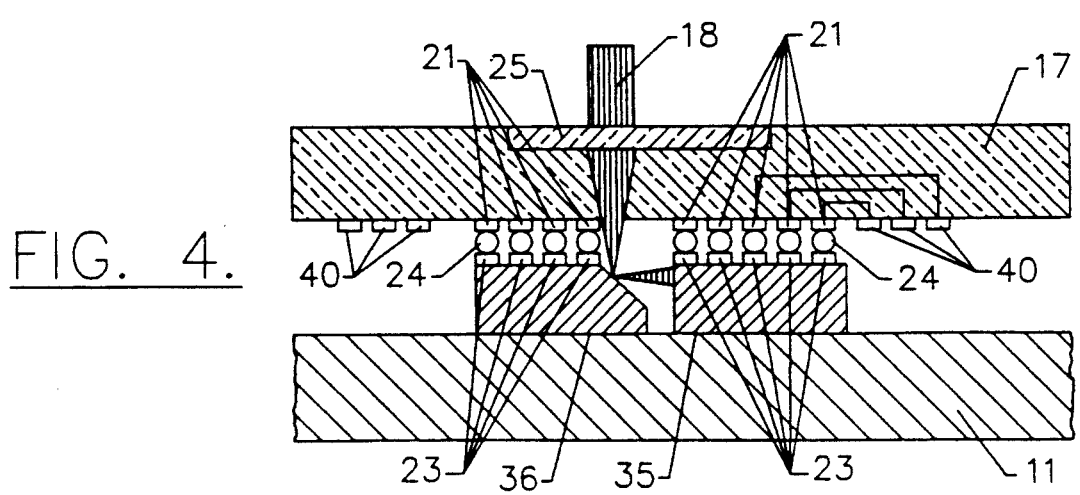
FIG. 4 is an enlarged schematic cross-sectional view of a portion of a multichip module according to the present invention including an edge-emitting laser array chip.

As best shown in FIGS. 3 and 4, the transparent substrate 17 includes arrays of electrical contact pads, or bonding pads, 20, 21 thereon which correspond to the array of electrical contact pads 22, 23 of the respective underlying integrated circuit chips 13, 15.

Another aspect of the multichip module 10 according to the present invention is that components thereof may be readily assembled with lateral alignment tolerances required for establishing precision optical interconnections. Conventional solder bump and reflow techniques, also know as flip-chip or C4 bonding, may be advantageously used. For example, a solder bump 24 may be provided on each electrical contact pad 20, 21 of the transparent substrate 17. The transparent substrate 17 is then positioned on the integrated circuit chips 13, 15. Heat is applied to reflow the solder bumps 24 thereby producing precise self-alignment under the influence of surface tension of the molten solder. Since the arrays of electrical contact pads on the transparent substrate 17 and on the integrated circuit chips 13, 15 are precisely controllable using conventional photolithographic techniques, the flip-chip bonding technique provides precise lateral alignment between the transparent substrate 17 and the integrated circuit chips 13, 15.

In the illustrated embodiment of FIG. 2, the transparent substrate 17 preferably includes a plurality of transmissive holograms 25 thereon or embedded therein. The transmissive holograms 25 direct optical beams from the laser array chips 15 to the detectors 14 of the integrated circuit chips 13. One or more reflective holograms 26 may also be provided on the transparent substrate 17. The holograms 25, 26 are preferably computer generated holograms (CGH) as are well known to those skilled in the art. The holograms 25, 26 cooperate with a planar mirror 30 positioned in spaced-apart relation from the transparent substrate 17 to direct optical beams 18 between integrated circuit chips 13, 15 to establish free space optical interconnections, or communications links, therebetween.

Optical interconnections may also be provided from one multichip module 10 to an adjacent module by providing a transmissive hologram 27 on a sidewall of the module so that an optical beam 18 may be directed therethrough to the adjacent module.

Referring to FIG. 4, there is shown a preferred laser array chip 15 for the multichip module 10. An edge-emitting laser array 35, as are known to those skilled in the art, is positioned on the heat sink 11 opposite a mirror 36 to redirect the output beams 18 at a right angle and through the substrate 17 and the hologram 25. The edge-emitting laser array 35 includes a series of edge-emitting lasers in side-by-side relation. The edge-emitting laser array 35 provides high data rates and is relatively inexpensive to fabricate.

As an alternative to the edge-emitting laser array 35 and mirror 36, a surface emitting laser or diode, not shown, may be used. For surface emitting lasers, any beam angle divergence between 15 and 50 degrees may be used. For example, if the separation distance between the transparent substrate 17 and the surface of the laser diode is 100 $\mu$m, the diameter of the laser beam on the bottom surface of the transparent substrate 17 is 100 $\mu$m $\times \tan(\delta/2)$, where $\delta$ is the full width, half power (FWHP) laser divergence angle. For a divergence angle of 15 degrees, the spot diameter is 26 $\mu$m. For a 50 degree divergence angle, the spot diameter is 93 $\mu$m. Since the spacing between contact pads 21 is typically about 200 $\mu$m, any divergence angle between about 15 and 50 degrees is feasible.

Electrical interconnections are also provided by the multichip module 10 according to the invention and these electrical interconnections may be used when high fanout or high data rates are not required. Electrical interconnections may also be used for distributing power within the multichip module 10. As shown in FIGS. 2–4, the transparent substrate 17 includes a pattern of electrical interconnection lines 40 thereon. As would be readily understood by those skilled in the art, the electrical interconnection lines 40 and the arrays of electrical contact pads 20, 21 may be formed by conventional metallization techniques.

For a single level of metallization to provide both the electrical contact pads 20 and the interconnection lines 40 on the transparent substrate 17, the laser spot diameter is limited to a value below about 50 $\mu$m which corresponds to a divergence angle of less than 28 degrees. This limits the area defined for the laser beam to less than about one quarter of the area occupied by the electrical contact pads 21.

On the other hand, the diameter of the laser spot on the top surface of the transparent substrate 17 must be larger than about 200 $\mu$m to allow the holographic interconnection a reasonably large connection density. For a 28 degree FWHP laser divergence angle and a refractive index of 1.77 for the transparent material (e.g. sapphire), an 800 $\mu$m thick transparent substrate 17 is needed to give a laser spot dimension of 220 $\mu$m at the top surface.

Thus, the electrical interconnection lines 40 and the arrays of electrical contact pads 20, 21 are appropriately spaced to permit a sufficient amount of laser power to pass therethrough. Stated in other words, the interconnection lines 40 and the arrays of electrical contact pads 20, 21 must have a sufficiently low density to permit adequate laser power to be transmitted by the laser array chip 15 and then received by the detector 14. Accordingly, as would be readily understood by those skilled in the art, different thicknesses of the transparent substrate 17 may be used for different laser divergence angles.

FIGS. 5 and 6 illustrate a second embodiment of the multichip module 10' according to the invention. A mounting substrate 45 is positioned adjacent a heat sink 11'. The heat sink 11' may of the type described previously. In this embodiment of the multichip module 10', the electrical interconnection lines 40' are provided on the mounting substrate 45. In addition, the illustrated embodiment includes a plurality of interconnect chips 46, also referred to as holographic translator chips, positioned on the associated integrated circuit chips 13', 15'. As shown in FIG. 6, a holographic translator chip 46 includes a transparent substrate 17' with an array of electrical contact pads 20' thereon corresponding to the array of electrical contact pads 22' on the underlying integrated circuit chip 13'. Each of the corresponding electrical contact pads 20', 22' are electrically connected by a reflowed solder bump 24' as described above.

The holographic translator chip 46 also includes a portion which overlies the mounting substrate 45 and includes additional electrical contact pads 47 thereon to form an electrical connection with corresponding electrical contact pads 48 on the mounting substrate 45. Electrical interconnections may thus be formed between predetermined ones of the integrated circuit chips 13', 15' via the pattern of interconnection lines 40' on the mounting substrate 45. The pattern of electrical interconnection lines 40' may include one or more layers of patterned metal lines as would be known to those skilled in the art.

The holographic translator chip 46 includes a hologram 25' positioned on the surface of the transparent substrate 17' opposite the array of electrical contact pads 22', 47. As described above, the hologram 25' directs an optical beam 18' from the laser array chip 15' to the optical detectors 14'. As would be readily understood by those skilled in the art, a reflective hologram 26' may also be used in the embodiment of the multichip module 10' shown in FIG. 5 and the holographic translator chip 46 shown in FIG. 6.

Figure 7:
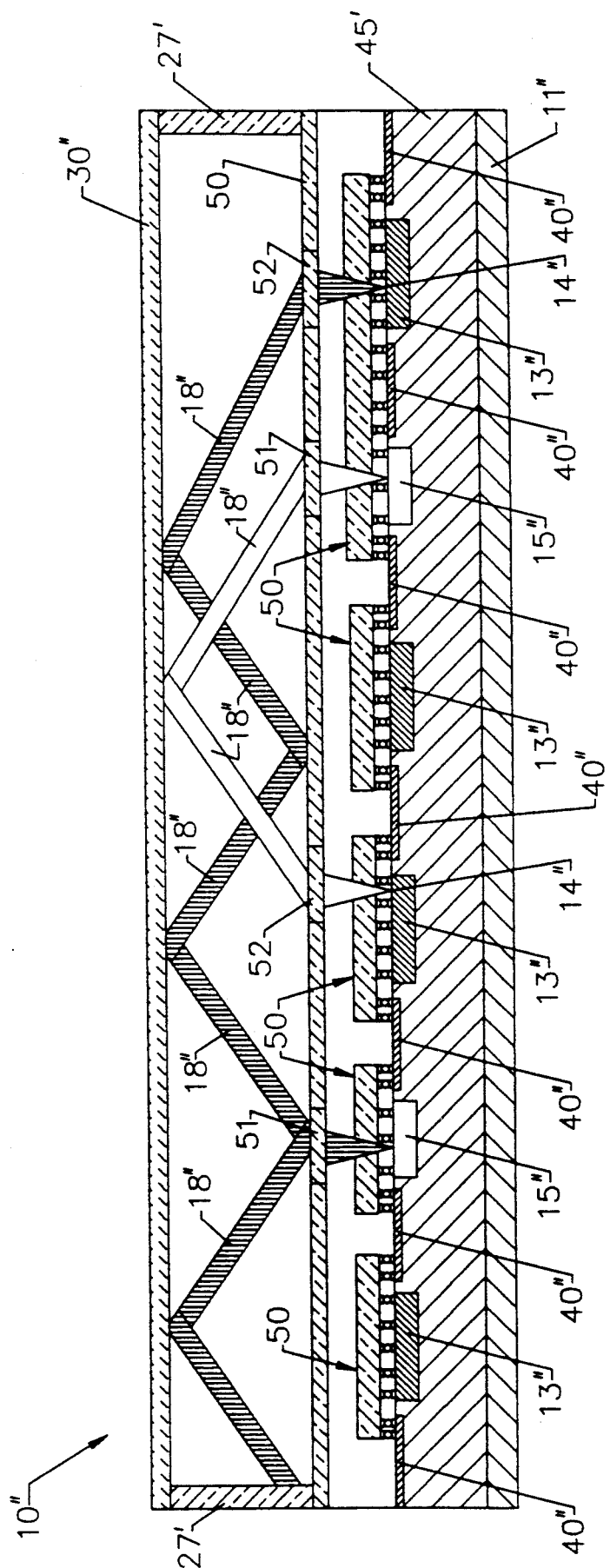
FIG. 7 is a schematic cross-sectional view of a third embodiment of a multichip module according to the invention.

FIG. 7 shows a third embodiment of the multichip module 10" of the present invention. In this embodiment, a hologram 25" is positioned in spaced-apart relation from the interconnect chips 50, also referred to herein as translator chips. The hologram 25" may preferably be about 1 mm above the translator chips 50. The translator chips 50 are similar to the holographic translator chips 46 as shown in FIG. 6 except the translator chips 50 do not include an individual hologram 25' as do the holographic translator chips 46. The translator chips 50 include an optically transparent substrate and electrical contact pads thereon.

As shown in FIG. 7, a planar mirror 30" is positioned about 2 cm above the hologram 25". The hologram 25" may be divided into an array of subholograms 51, 52 associated the laser beams 18" from the laser array transmitter chips 15" to the optical detectors 14". The transmitter subhologram 51 may divide the light into F optical beams to provide a fanout of F. Each beam is directed onto the appropriate detector subhologram 52 after reflection off the planar mirror 30". Each detector subhologram 52 acts as a single lens to focus the incident beam 18" onto the underlying detector 14".

Since a subhologram 51, 52 is provided for both the transmitter and the detector respectively, a double pass CGH system is defined by the illustrated embodiment of FIG. 7 and also in the previously described embodiments. The double pass CGH system minimizes alignment requirements and maximizes connection density capabilities. It is estimated that for a 50 degree CGH deflection angle, the double pass CGH system can provide over 80,000 connections, assuming an average fanout of four and a 10 cm diameter of the multichip module.

The hologram 25" must be accurately aligned with the multichip module 10". A spacer plate of about 1 mm thick is attached to the module and the hologram 25" is fabricated by etching this plate several times with photolithographic techniques. Alignment marks on the hologram 25" are used to achieve an accuracy of about 2 $\mu$m. Therefore, to compensate for this slight alignment error, the optical detectors 14" are preferably designed so that the diameter of their active area is about 4 $\mu$m larger than the diameter of an optical beam spot as focussed by the hologram 25". Since the diameter of each subhologram 52 in this embodiment is preferably about 500 $\mu$m, a 50 $\mu$m dimension change over the length of an optical interconnection would result in only about a 10% reduction in received optical power.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A microelectronic module comprising:

a first substrate;

an array integrated circuit chips each having a first surface adjacent said first substrate, each of said integrated circuit chips including an array of electrical contact pads on a second surface thereof opposite said first surface, a first integrated circuit chip further including an optical transmitter generating an optical beam, and a second integrated circuit chip further including an optical detector for receiving the optical beam from said optical transmitter;

a second substrate overlying the second surfaces of said first and second integrated circuit chips, said second substrate including means for permitting passage therethrough of the optical beam from said optical transmitter to said optical detector;

a hologram positioned in the path of the optical beam from said optical transmitter to said optical detector for directing the optical beam therebetween to optically interconnect said first and second integrated circuit chips;

an array of electrical contact pads on said second substrate corresponding to the array of electrical contact pads on a respective underlying integrated circuit chip;

a pattern of electrical interconnection lines on at least one of said first substrate and said second substrate to electrically interconnect predetermined ones of said array of integrated circuit chips; and a solder bump between each electrical contact pad on said second substrate and the respective electrical contact pad on the underlying integrated circuit chip, to establish an electrical connection between the electrical contact pad on said second substrate and the respective electrical contact pad on the underlying integrated circuit chip and to facilitate alignment of said first integrated circuit chip including an optical transmitter and said second integrated circuit chip including an optical detector, with respect to said second substrate.

2. The microelectronic module according to claim 1 further comprising a mirror positioned in spaced-apart relation from said hologram and in the path of the optical beam from said optical transmitter to said optical detector.

3. The microelectronic module according to claim 2 further comprising means for supporting said hologram in spaced-apart relation from said second substrate.

4. The microelectronic module according to claim 2 wherein said hologram is positioned on said second substrate.

5. The microelectronic module according to claim 1 wherein said first substrate includes a heat sink for removing heat from said array of integrated circuit chips.

6. The microelectronic module according to claim 1 wherein said means for permitting passage therethrough of the optical beam from said optical transmitter to said optical detector comprises an optically transparent material forming said second substrate.

7. The microelectronic module according to claim 1 wherein said optical transmitter comprises an edge-emitting laser.

8. The microelectronic module according to claim 7 further comprising a mirror positioned opposite said edge-emitting laser for directing the optical beam from said edge-emitting laser through said second substrate.

9. A microelectronic module comprising:
a substrate comprising an optically transparent material;
an array of integrated circuit chips each having a predetermined surface positioned on said substrate, each of said integrated circuit chips including an array of electrical contact pads on the predetermined surface thereof, a first integrated circuit chip further including an optical transmitter for generating an optical beam, a second integrated circuit chip further including an optical detector for receiving the optical beam from said optical transmitter;
a hologram on said substrate for directing the optical beam from said optical transmitter to said optical detector to optically interconnect said first and second integrated circuit chips;
an array of electrical contact pads on said substrate corresponding to the array of electrical contact pads on respective integrated circuit chips;
a pattern of electrical interconnection lines on said substrate for electrically interconnecting predetermined ones of said array of integrated circuit chips; and
a solder bump between each electrical contact pad on said substrate and the respective electrical contact pad on the underlying integrated circuit chip, to establish an electrical connection between the electrical contact pad on the substrate and the electrical contact pad on the underlying integrated circuit chip and to facilitate alignment of said first integrated circuit chip including an optical transmitter and said second integrated circuit chip including an optical detector, with respect to said substrate.

10. The microelectronic module according to claim 9 further comprising a heat sink positioned on said array of integrated circuit chips on a surface thereof opposite said predetermined surface.

11. The microelectronic module according to claim 9 further comprising a mirror positioned in spaced-apart relation from said hologram in the path of the optical beam from said optical transmitter to said optical detector.

12. The microelectronic module according to claim 9 wherein said optical transmitter comprises an edge-emitting laser.

13. The microelectronic module according to claim 12 further comprising a mirror positioned opposite said edge-emitting laser for directing the optical beam from said edge-emitting laser through said substrate.

14. A microelectronic module comprising;
a first substrate;
an array of integrated circuit chips each having a first surface positioned on said first substrate, each of said integrated circuit chips including an array of electrical contact pads on a second surface thereof opposite said first surface, a first integrated circuit chip further including an optical transmitter for generating an optical beam, a second integrated circuit chip further including an optical detector for receiving the optical beam from said optical transmitter;
a second substrate and a third substrate overlying respective second surfaces of said first and second integrated circuit chips, said second and third substrates comprising optically transparent material for permitting passage therethrough of the optical beam from said optical transmitter to said optical detector;
a hologram positioned in the path of the optical beam from said optical transmitter to said optical detector for directing the optical beam therebetween to optically interconnect said first and second integrated circuit chips;
an array of electrical contact pads on each of said second and third substrates corresponding to the array of electrical connections pads on the respective underlying integrated circuit chip; and
a pattern of electrical interconnection lines on said first substrate for electrically interconnecting predetermined ones of said array of integrated circuit chips and
a solder bump between each electrical contact pad on said second and third substrates and the respective electrical contact pad on the underlying integrated circuit chips, to establish an electrical connection between the electrical contact pad on the integrated circuit chip and the electrical contact pad on said second or third substrates and to facilitate alignment of said first integrated circuit chip including an optical transmitter and said second integrated circuit chip including an optical detector, with respect to said second and third substrates.

15. The microelectronic module according to claim 14 further comprising a mirror positioned in spaced-apart relation from said hologram and in the path of the optical beam from said optical transmitter to said optical detector.

16. The microelectronic module according to claim 14 further comprising means for supporting said hologram in spaced-apart relation from said second and third substrates.

17. The microelectronic module according to claim 14 wherein said hologram is positioned on at least one of said second and third substrates.

18. The microelectronic module according to claim 14 wherein said first substrate includes a heat sink for removing heat from said array of integrated circuit chips.

19. The microelectronic module according to claim 14 wherein said optical transmitter comprises an edge-emitting laser.

20. The microelectronic module according to claim 19 further comprising a mirror positioned opposite said edge-emitting laser for directing the optical beam from said edge-emitting laser through said second substrate.

21. An interconnect chip for facilitating optical and electrical interconnections to an integrated circuit chip having a first surface thereof adjacent a mounting substrate, the integrated circuit chip including an array of electrical contact pads on a second surface thereof opposite the first surface, the integrated circuit chip further including at least one of an optical detector and an optical transmitter, the mounting substrate having an array of electrical contact pads thereon adjacent the periphery of the integrated circuit chip, said interconnect chip comprising:

an optically transparent substrate for permitting an optical beam to pass therethrough to establish an optical interconnection with the integrated circuit chip, said optically transparent substrate adapted to overlie the integrated circuit chip and a portion of the mounting substrate; and an array of electrical contact pads on said optically transparent substrate adapted for electrically contacting respective underlying electrical contact pads of the integrated circuit chip and electrical contact pads of the mounting substrate to establish electrical interconnections with the integrated circuit chip and a solder bump on each electrical contact pad of said array of electrical contact pads to establish an electrical connection with the corresponding electrical contact pad of the underlying integrated circuit chip and to facilitate alignment of said interconnect chip with respect to the integrated circuit chip, including at least one of an optical detector and an optical transmitter.

22. The interconnect chip according to claim 21 further comprising a hologram on said optically transparent substrate for directing an optical beam to establish an optical interconnection with the integrated circuit help.

23. The interconnect chip according to claim 21 further comprising a pattern of electrical interconnection lines on said optically transparent substrate.

24. The interconnect chip according to claim 23 wherein said pattern of electrical interconnection lines on said optically transparent substrate has a sufficiently low density of lines to permit a predetermined amount of optical power to pass therethrough.

25. An interconnect chip for facilitating optical and electrical interconnections to a integrated circuit chip having an array of electrical contact pads on a surface thereof and at least one of an optical detector and an optical transmitter, said interconnect chip comprising:

a substrate adapted to be positioned overlying the integrated circuit chip, said substrate comprising optically transparent material for permitting an optical beam to pass therethrough to establish an optical interconnection with the integrated circuit chip;

an array of electrical contact pads on said substrate adapted for electrically contacting respective electrical contact pads of the underlying integrated circuit chip;

a hologram on said substrate for directing an optical beam to establish an optical interconnection to the integrated circuit chip; and a solder bump on each electrical contact pad of said array of electrical contact pads to establish an electrical connection with the corresponding electrical contact pad of the underlying integrated circuit chip and to facilitate alignment of said interconnect chip with respect to the integrated circuit chip, including at least one of an optical detector and an optical transmitter.

26. The interconnect chip according to claim 25 further comprising a pattern of electrical interconnection lines on said optically transparent substrate.

27. The interconnect chip according to claim 26 wherein said pattern of electrical interconnection lines on said optically transparent substrate has a sufficiently low density of lines to permit a predetermined amount of optical power to pass therethrough.

* * * * *

UNITED STATES PATENT AND TRADEMARK OFFICE
CERTIFICATE OF CORRECTION

PATENT NO. : 5,237,434

DATED : August 17, 1993

INVENTOR(S) : Feldman, et al.

It is certified that error appears in the above-identified patent and that said Letters Patent is hereby corrected as shown below:

On the title page: Item [56]

OTHER PUBLICATIONS:

Publication No. 1: "1076" should be --1076-1085--.

Publication No. 2: "1742" should be --1742-1751--.

Publication No. 3: "3134" should be --3134-3137--.

Publication No. 4: "Feb. 11" should be --Nov. 2--.

Publication No. 5: After "No. 4" insert --pp. 50-54--.

Column 2, line 33, please delete "A".

Column 2, line 35, "Consideration" should be --Considerations"--.

UNITED STATES PATENT AND TRADEMARK OFFICE
CERTIFICATE OF CORRECTION

Page 2 of 3

PATENT NO. : 5,237,434
DATED : August 17, 1993
INVENTOR(S) : Feldman, et al.

It is certified that error appears in the above-identified patent and that said Letters Patent is hereby corrected as shown below:

Column 7, line 63, after "associated" insert --with--.

Column 8, line 41, after "array" insert --of--.

Column 10, line 47, "connections" should be --connection--.

Column 10, line 48, delete "and".

Column 10, line 52, after "chips" insert --;--.

Column 11, line 36, delete "and".

Column 11, line 44, after "chips" insert --;--.

UNITED STATES PATENT AND TRADEMARK OFFICE
CERTIFICATE OF CORRECTION

PATENT NO. : 5,237,434
DATED : August 17, 1993
INVENTOR(S) : Feldman, et al

It is certified that error appears in the above-indentified patent and that said Letters Patent is hereby corrected as shown below:

Column 12, line 7, "help" should be --chip --.
        line 17, "a" should be --an --.

Signed and Sealed this

Twenty-sixth Day of July, 1994

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,237,434            Page 1 of 2

DATED : August 17, 1993

INVENTOR(S) : Feldman, et al

It is certified that error appears in the above-indentified patent and that said Letters Patent is hereby corrected as shown below:

On the title page, Item [73]:

Assignee:

Add: --and The University of North Carolina, Charlotte, NC--

OTHER PUBLICATIONS:

Publication No. 1: "1076" should be --1076-1085--.

Publication No. 2: "1742" should be --1742-1751--

Publication No. 3: "3134" should be --3134-3137--.

Publication No. 4: "Feb. 11" should be --Nov. 2-

Publication No. 5: After "No. 4" insert --pp. 50-54--.

Column 2, line 33, please delete "A".

Column 2, line 35, "Consideration" should be --Considerations"--.

UNITED STATES PATENT AND TRADEMARK OFFICE
CERTIFICATE OF CORRECTION

PATENT NO. : 5,237,434
DATED : August 17, 1993
INVENTOR(S) : Feldman, et al

It is certified that error appears in the above-indentified patent and that said Letters Patent is hereby corrected as shown below:

Column 7, line 63, after "associated" insert --with--.

Column 8, line 41, after "array" insert --of--.

Column 10, line 47, "connections" should be --connection--.

Column 10, line 48, delete "and".

Column 10, line 52, after "chips" insert --;--.

Column 11, line 36, delete "and".

Column 11, line 44, after "chip" insert --;--.

Column 12, line 7, "help" should be --chip--

Column 12, line 17, "a" should be --an--

Signed and Sealed this

Sixth Day of September, 1994

Attest:

BRUCE LEHMAN

Attesting Officer     Commissioner of Patents and Trademarks